United States Patent [19]
Park et al.

[11] Patent Number: 6,094,376
[45] Date of Patent: Jul. 25, 2000

[54] DATA OUTPUT BUFFER CONTROL CIRCUIT FOR A SEMICONDUCTOR MEMORY DEVICE

[75] Inventors: Pil-Soon Park, Suwon; Kyung-Woo Kang, Kyungki-do; Soo-In Cho, Seoul, all of Rep. of Korea

[73] Assignee: Samsung Electronics, Co., Ltd., Suwon, Rep. of Korea

[21] Appl. No.: 08/998,287

[22] Filed: Dec. 24, 1997

[30]     Foreign Application Priority Data

Dec. 24, 1996 [KR] Rep. of Korea ............... 96/71714

[51] Int. Cl.[7] .................................................. G11C 16/04
[52] U.S. Cl. ............... 365/189.05; 365/193; 365/194; 365/233.5
[58] Field of Search ................... 365/189.05, 194, 365/233.5, 193

[56]           References Cited

U.S. PATENT DOCUMENTS

| | | | |
|---|---|---|---|
| 5,384,735 | 1/1995 | Park et al. | 365/189.05 |
| 5,440,511 | 8/1995 | Yamamoto et al. | 365/189.05 |
| 5,600,607 | 2/1997 | Furutani | 365/233.5 |

*Primary Examiner*—David Nelms
*Assistant Examiner*—Hoai V. Ho
*Attorney, Agent, or Firm*—Marger Johnson & McCollom, P.C.

[57]           ABSTRACT

A data output buffer control circuit for a semiconductor memory device assures a column address setup time and a valid data setup time in EDO mode by eliminating short glitches in the data output buffer. The circuit assures the column address setup time by disabling the data output buffer for a predetermined period of time after an address transition, regardless of the state of a column address strobe signal. The circuit assures the setup time for valid data by sensing when the address is set up relative to when the column address strobe signal is activated, and then enabling the data output buffer so as to maintain invalid data in the data output buffer long enough to prevent a short glitch in the data output buffer if the column address is set up before the column address strobe signal is activated. The circuit includes a pulse generator for generating a pulse signal each time it senses a column address transition, and a latch circuit for combining the pulse signal with the column address strobe signal so as to generate a buffer control signal for enabling and disabling the data output buffer.

13 Claims, 6 Drawing Sheets

DATA OUTPUT BUFFER CONTROL CIRCUIT FOR A SEMICONDUCTOR MEMORY DEVICE

This application corresponds to Korean patent application No. 71714/1996 filed Dec. 24, 1996 in the name of Samsung Electronics Co., Ltd., which is herein incorporated by reference for all purposes.

BACKGROUND OF THE INVENTION

1. Field of the Invention

This invention relates generally to semiconductor memory devices, and more particularly, to data output buffer control circuits for extended data output mode.

2. Description of the Related Art

In a semiconductor memory device, the extended data output (EDO) mode of operation is different from a fast page mode of operation in that the data output signal DOUT continues to maintain the previous data without being switched to a high impedance state between data bits. Instead, to reduce the cycle time and increase speed, the data output signal DOUT is changed directly to the data of the next cycle when the column address strobe signal CASB is activated, even if the column address strobe signal CASB is set to logic "HIGH", that is, even if it is precharged.

However, in the EDO mode of operation, if a column address CAi is received during a specific column address setup time tASC, the data output buffer can malfunction. This malfunction occurs in a boosting circuit which includes a boost capacitor that is precharged and discharged at both ends. The boost capacitor plays an important role in increasing the efficiency of the boosting circuit, and therefore, such boosting circuits are widely used.

Figure 1:
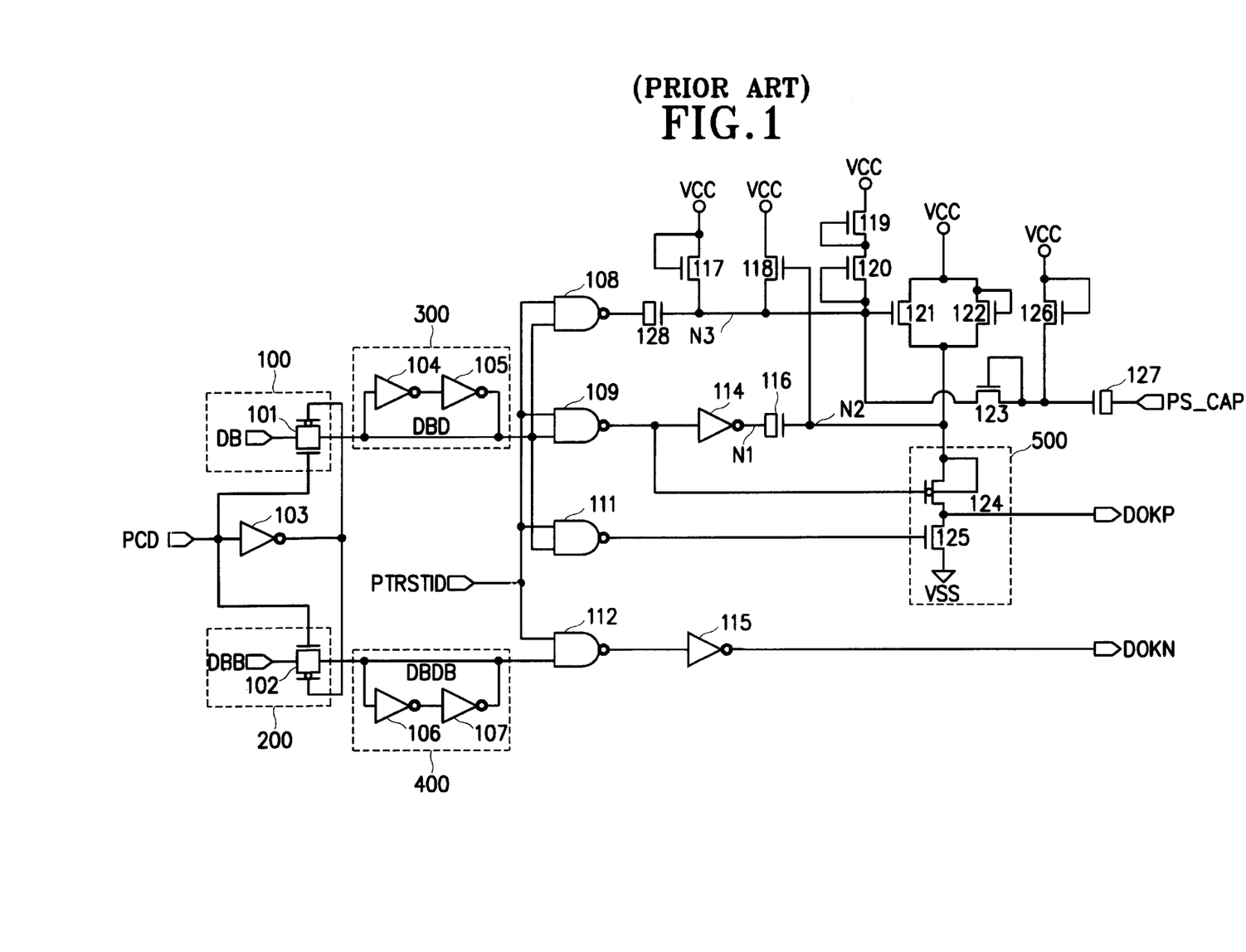
FIG. 1 is a circuit diagram of a conventional data output buffer having a boosting circuit.

FIG. 1 is a detailed circuit diagram of a conventional data output buffer having such a boosting circuit. First and second input controllers 100 and 200 consist of transmission gates 101 and 102 and control data signals from data buses (hereinafter, referred to as nodes) DB and DBB, respectively, responsive to a data output buffer activation signal PCD. First and second latch circuits 300 and 400 include inverters 104 and 105 and inverters 106 and 107, respectively. The first and second latch circuits 300 and 400 temporarily store signals received through the transmission gates 101 and 102 and generate latch signals through nodes DBD and DBDB, respectively. NAND gates 108, 109, 111 and 112 receive the latch signals generated through the nodes DBD and DBDB and generate NAND outputs responsive to a control signal PRTSTID.

A capacitor 128, which has an input terminal connected to the output terminal of the NAND gate 108, pumps an input signal. A diode-connected NMOS transistor 117 precharges a node N3 to an external power voltage VCC. Serially connected NMOS transistors 119 and 120 supply a constant voltage to a pull-up transistor 124 which is part of a boosting driver 500. An NMOS transistor 118 has a source connected to the node N3, a gate connected to a node N2 and a drain connected to the external power voltage VCC.

If node N2 is logic "HIGH", the NMOS transistor 118 supplies the external power voltage VCC to node N3. NMOS transistors 121 and 122, each of which has one terminal connected to the external power voltage VCC and the another terminal connected to the node N2, precharge the node N2 to an internal power voltage. The nodes N1 and N2 are both terminals of a boosting capacitor 116. The data output driver 500 includes the PMOS transistor 124 and an NMOS transistor 125 which are serially connected to each other. The gate of PMOS transistor 124 is connected to the output terminal of the NAND gate 109, and the gate of the NMOS transistor 125 is connected to the output terminal of the NAND gate 111. The data output driver 500 generates a data output signal DOKP at a boosted level. An inverter 115 has an input terminal connected to the output terminal of the NAND gate 112 and generates a low voltage level data output signal DOKN.

In operation, node N1 is charged or discharged by inverter 114 which is a driver. Node N2 should be precharged to the internal power voltage for effective boosting. When node N2 is precharged, node N2 is raised to 2 VCC by boosting action if node N1 is switched from logic "LOW" to logic "HIGH". A voltage of this boosting level is supplied to the PMOS transistor 124 to drive the data output driver 500, which in turn drives the data output signal DOKP at a logic "HIGH" level out of the device.

In contrast, if node N1 is discharged to logic "LOW" by the inverter 114 of the driver, node N2 is lowered to VCC from 2 VCC. When node N1 is not fully discharged, then when node N1 is re-charged by the inverter 114 the voltage swing at node N1 is reduced and the boosting efficiency is lowered. Then, the voltage level at node N2 does not reach 2 VCC, and the voltage level of the data output signal DOKP, which is transferred through the PMOS transistor 124, is lowered, thereby lowering the voltage level of the signal output from the device. Since the output signal does not satisfy the specification value for a logic "HIGH" signal, the circuit may malfunction. The malfunction occurs when the data output signal DOKP is supposed to be at the logic "HIGH" level, but does not satisfy the specification value for a logic "HIGH" signal during the specific column address setup time in EDO mode.

Figure 2:
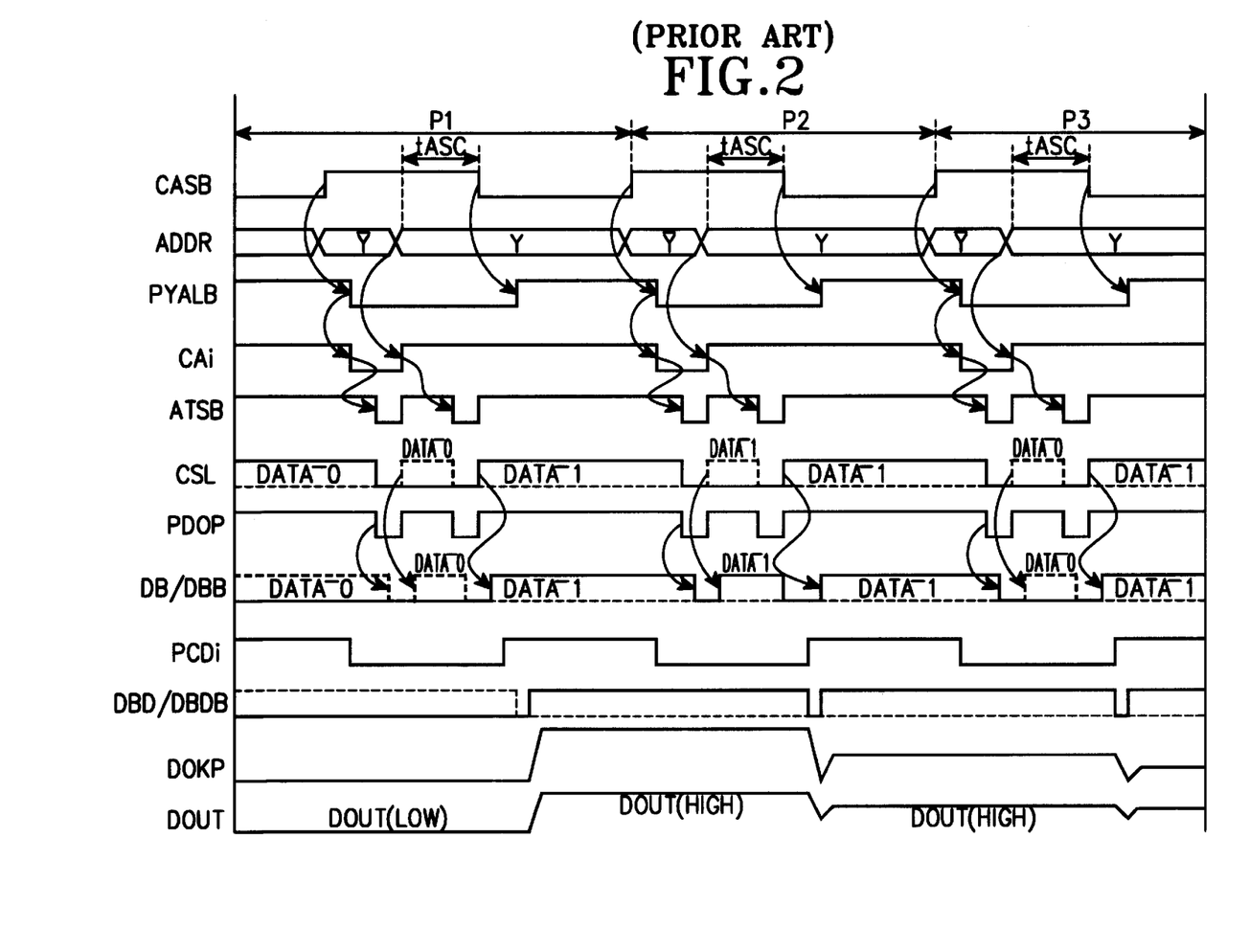
FIG. 2 is an timing chart illustrating the operation of the circuit of FIG. 1.

FIG. 2 is an timing chart illustrating the operation of the circuit of FIG. 1. In FIG. 2, the interval P1 indicates a range in which the data output DOUT is changed to logic "HIGH" from logic "LOW". Interval P2 designates a range in which the data output is changed from logic "HIGH" to logic "HIGH" of another level by the input of another column address. Interval P3 designates a range in which the output voltage level of a logic "HIGH" signal falls even further when the current and previous data are both logic "HIGH".

Referring to FIG. 2, a column address setup time tASC designates the setup time of a column address. The data output buffer activation signal PCD in EDO mode is a signal for activating the data output buffer. Data having a logic "HIGH" level is latched in the first latch circuit 300, and data having a logic "LOW" level is latched in the second latch circuit 400. If the column address strobe signal CASB is precharged to logic "HIGH", a new column address CAi is received and a precharge voltage is generated on the data bus DB by this column address. Thereafter, if the column address strobe signal CASB is activated, and thus, the data output buffer activation signal PCD is activated, a short glitch is generated at the node DBD of the first latch circuit 300. The electric charge on the node N1 is not sufficiently discharged by this short glitch. Although the data output should be logic "HIGH" by the next address, the data output, which is supposed to be generated as a logic "HIGH" signal, has a lower level than the voltage level of the previous logic "HIGH" signal because the node N1, which is not full discharged, is again charged by the control of the address. Therefore, the data output having a lower level logic "HIGH" causes a malfunction when driving data out of the memory device since the data output is not at a sufficient level to be detected as a logic "HIGH".

Moreover, the short glitch at the node DBD appears only in EDO mode. This is because, in the EDO mode, the previous data output is maintained even if the column address strobe signal CASB is precharged, and the next data output is generated when the column address strobe signal CASB is activated again. The malfunction occurs only during the specific column address setup time.

Figure 3:
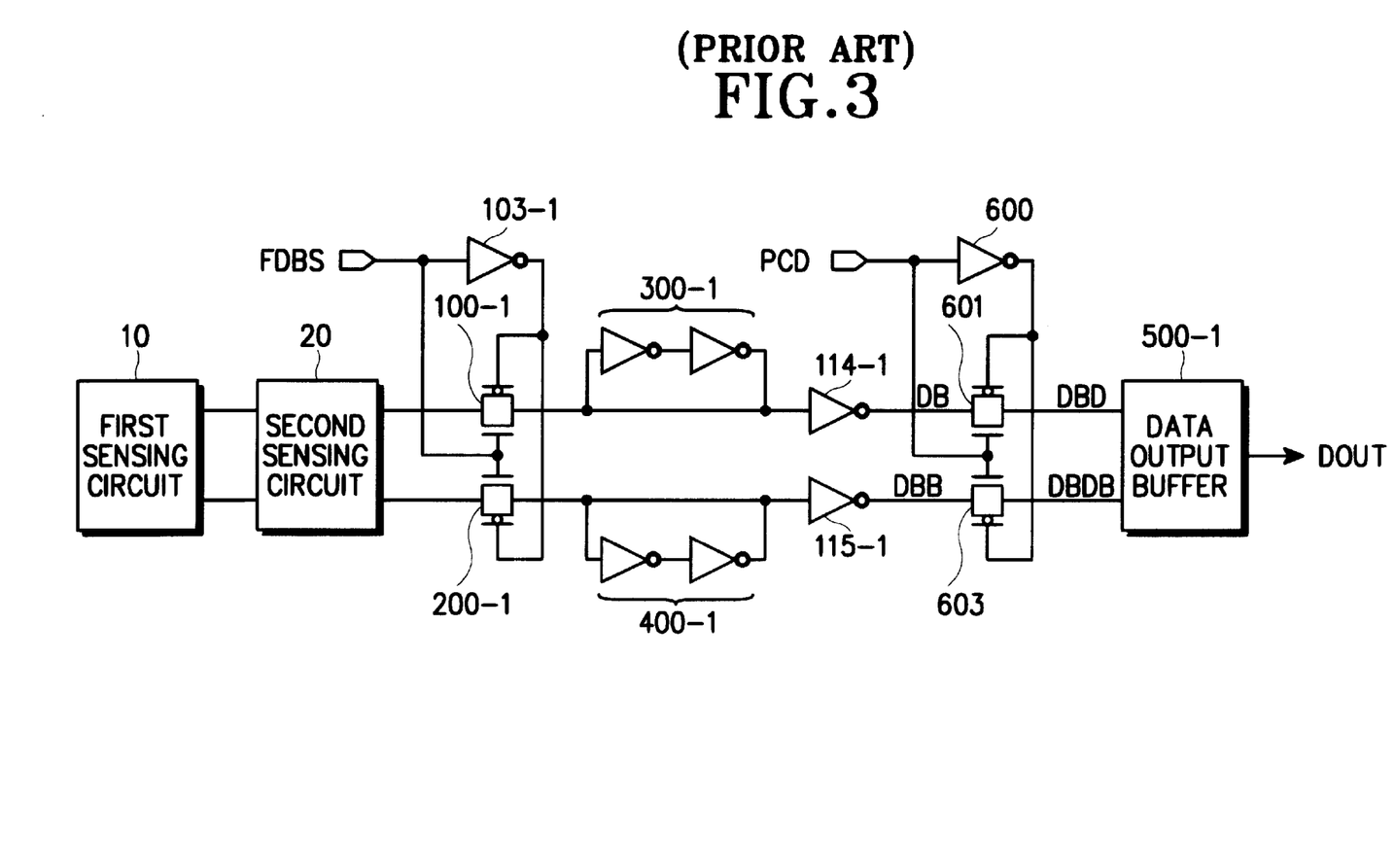
FIG. 3 is a circuit diagram of a conventional data output buffer control circuit.

FIG. 3 illustrates a conventional data output buffer control circuit. A first sensing circuit 10 senses and amplifies data through a bit line generated from a memory cell. A second sensing circuit 20 having input terminals connected to the output terminals of the first sensing circuit 10 senses and amplifies the data again and generates data through a driver. The data generated from the second sensing circuit 20 is applied to a first switching circuit consisting of transmission gates 100-1 and 200-1. The first switching circuit is controlled by a control signal FDBS and an inverter 103-1. The output of the first switching circuit is applied to first and second latch circuits 300-1 and 400-1. Signals latched through the first and second latch circuits 300-1 and 400-1 are applied to inverters 1141 and 115-1, respectively, which function as drivers.

The outputs of the inverters 114-1 and 115-1 are controlled by the data output buffer activation signal PCD through transmission gates 601 and 603. The outputs of the transmission gates 601 and 603 are supplied through the nodes DBD and DBDB to a data output buffer 500-1. The data output signal DOUT, which is buffered by the data output buffer 500-1, is transmitted to the exterior of the chip. In operation, the control signal FDBS, which controls the first switching circuit, is activated by the column address strobe signal CASB. If the column address strobe signal CASB is precharged, a new column address is received. The control signal is precharged to logic "HIGH" by an address transition sensing signal ATSB which is changed by the column address. Hence, although the nodes DB and DBB are not precharged, if the signal PCD is activated when ineffective data is received as logic "LOW", a short glitch is generated.

Figure 4:
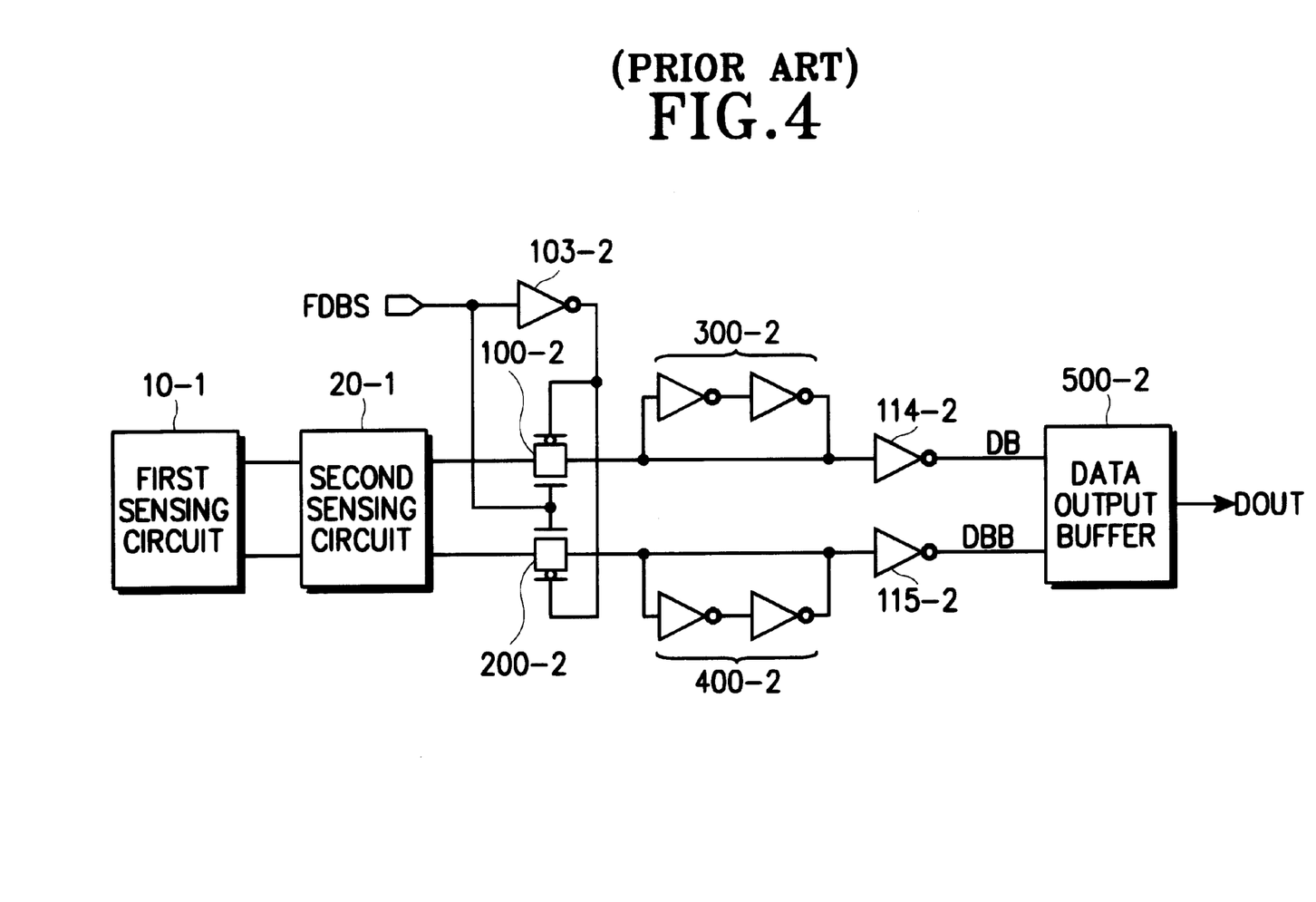
FIG. 4 is a circuit diagram of another conventional data output buffer control circuit.

FIG. 4 illustrates another conventional data output buffer control circuit. The circuit of FIG. 4 is similar to that of FIG. 3, but includes no second switching circuit. In the circuit of FIG. 4, the control signal FDBS, which controls the first switching circuit, is activated by the column address and the column address strobe signal CASB. However, the short glitch is also generated in the circuit of FIG. 4.

Accordingly, a need remains for a data output buffer control circuit which overcomes the problems described above.

SUMMARY OF THE INVENTION

Therefore, it is an object of the present invention to provide a data output buffer control circuit for a semiconductor memory device which ensures stable data output in an extended data output mode.

Another object of the present invention is to provide a data output buffer control circuit for a semiconductor memory device which ensures output data having a sufficient logic level by preventing a data output buffer activation signal from being activated during a column address setup time and preventing a short glitch from being supplied to a data output buffer irrespective of the state of a column address strobe signal while the column address strobe signal is activated.

To accomplish these and other objects, a data output buffer control circuit for a semiconductor memory device constructed in accordance with the present invention assures a column address setup time and a valid data setup time in EDO mode by eliminating short glitches in the data output buffer. The circuit assures the column address setup time by disabling the data output buffer for a predetermined period of time after an address transition, regardless of the state of a column address strobe signal. The circuit assures the setup time for valid data by sensing when the address is set up relative to when the column address strobe signal is activated, and then enabling the data output buffer so as to maintain invalid data in the data output buffer long enough to prevent a short glitch in the data output buffer if the column address is set up before the column address strobe signal is activated.

The circuit includes a pulse generator for generating a pulse signal each time it senses a column address transition, and a latch circuit for combining the pulse signal with the column address strobe signal so as to generate a buffer control signal for enabling and disabling the data output buffer.

One aspect of the present invention is a method for controlling a data output buffer for a semiconductor memory device, the method comprising: sensing transitions in an address signal; generating a pulse signal responsive to transitions in the address signal; and controlling the data output buffer responsive to a column address strobe signal and the pulse signal.

Controlling the data output buffer responsive to the column address strobe signal and the pulse signal can include disabling the data output buffer for a predetermined period of time after an address transition, regardless of the state of a column address strobe signal, thereby assuring a column address setup time. Controlling the data output buffer responsive to the column address strobe signal and the pulse signal can also include: sensing when the address is set up relative to when the column address strobe signal is activated; and enabling the data output buffer so as to maintain invalid data in the data output buffer long enough to prevent a short glitch in the data output buffer if the column address is set up before the column address strobe signal is activated, thereby assuring a setup time for valid data.

Controlling the data output buffer responsive to the column address strobe signal and the pulse signal can also include: generating a buffer activation signal responsive to the column address strobe signal and the pulse signal; and controlling the data output buffer responsive to the buffer activation signal.

Another aspect of the present invention is a data output buffer control circuit of a semiconductor memory device having a first sensing circuit for sensing and amplifying first and second data of a pair of bit lines, a second sensing circuit for sensing and amplifying output signals of said first sensing circuit, first and second switching circuits for selectively transmitting output signals of said second sensing circuits when a column address strobe signal and an activation signal are supplied respectively, and a latch circuit for latching output signals of said first switching circuit, said data output buffer control circuit comprising: an automatic pulse generating circuit for receiving an address transition sensing signal enabled when said column address strobe signal is changed and generating pulses each having a predetermined width; and a logic controller connected to an input terminal of said second switching circuit, for generating said activation signal to ensure a column address setup time by logic combination of a first control signal enabled by said column address strobe signal, a second control signal and said pulse.

A further aspect of the present invention is a data output buffer control circuit of a semiconductor memory device having a first sensing circuit for sensing and amplifying first and second data of a pair of bit lines, a second sensing circuit for sensing and amplifying output signals of said first sensing circuit, first and second switching circuits for selectively transmitting output signals of said second sensing circuits when a column address and an activation signal are supplied respectively, and a latch circuit for latching output signals of said first switching circuit, said data output buffer control circuit comprising: an automatic pulse generating circuit for generating an automatic pulse having a predetermined width in response to an address transition sensing signal, thus to ensure a setup time of effective data; and a logic controller for generating said activation signal activated by a column address strobe signal and said automatic pulse, wherein signals enabled by said automatic pulse and said column address form a latch so as to be exclusively activated.

An advantage of the present invention is that it prevents reductions in the logic level of data output from a data output buffer.

The foregoing and other objects, features and advantages of the invention will become more readily apparent from the following detailed description of a preferred embodiment of the invention which proceeds with reference to the accompanying drawings.

DETAILED DESCRIPTION

Figure 5:
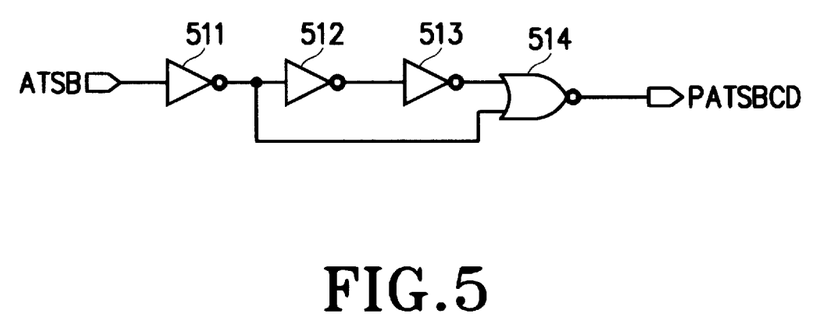
FIG. 5 is a circuit diagram of an embodiment of an automatic pulse generating circuit according to the present invention.

FIG. 5 is a circuit diagram of an embodiment of an automatic pulse generating circuit in accordance with the present invention. The circuit of FIG. 5 generates an activation control pulse signal PATSBCD in response to an address transition sensing signal ATSB which is a signal for indicating when an address transition is sensed. The address transition sensing signal ATSB is used to precharge a node DB. The signal ATSB is applied to the input terminal of an inverter 511. An inverter chain consisting of series connected inverters 512 and 513 has an input terminal connected to the output terminal of the inverter 511. A NOR gate 514 receives the output signal of the inverter 511 at one input terminal and the output signal from the inverter chain at its other input terminal. The signal ATSB is provided at the output terminal of the NOR gate 514. Therefore, when the address transition sensing signal ATSB is activated, a pulse is automatically generated in the activation control pulse signal PATSBCD.

Figure 6:
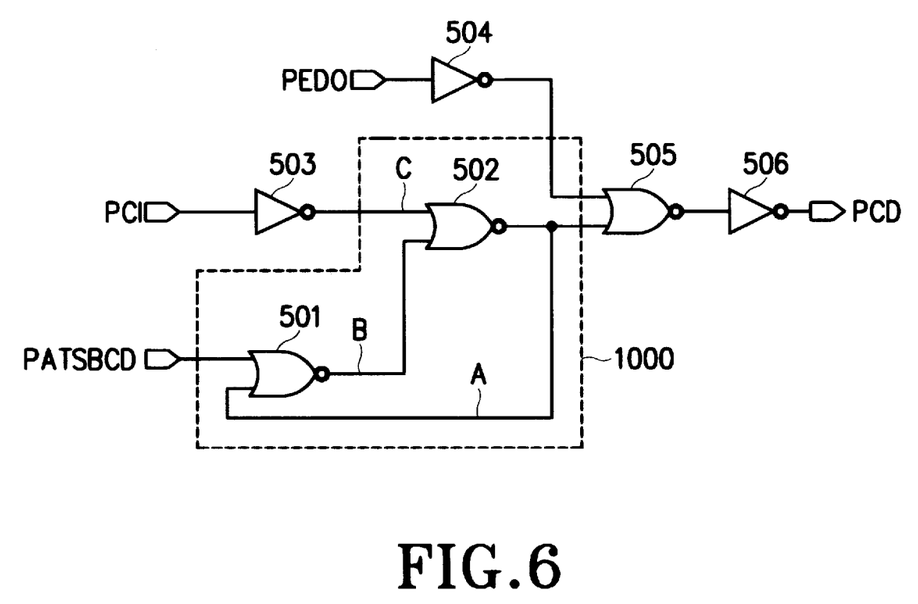
FIG. 6 is a circuit diagram of an embodiment of a data output buffer control circuit according to the present invention.

FIG. 6 is a circuit diagram of an embodiment of a data output buffer control circuit according to the present invention. The circuit of FIG. 6 generates the data output buffer activation signal PCD in response to the activation control pulse signal PATSBCD and includes inverters 503, 504, and 506, NOR gate 505, and a latch 1000 formed from NOR gates 501 and 502.

NOR gate 501 has a first input terminal coupled to receive the activation control pulse signal PATSBCD, and a second input terminal coupled to the output terminal of NOR gate 502 at a node "A". NOR gate 502 has a first input terminal coupled to the output terminal of inverter 503 at a node "C", and a second input terminal coupled to the output terminal of NOR gate 501 at a node "B". The input terminal of inverter 503 is coupled to receive a first control signal, for example, the signal PCI.

NOR gate 505 has a first input terminal coupled to the output terminal of inverter 504 and a second input terminal coupled to the output terminal of NOR gate 502, which, together with NOR gate 501 forms a latch. The input terminal of inverter 504 is coupled to receive a second control signal, for example, the signal PEDO. An inverter 506 has an input terminal connected to an output terminal of NOR gate 505.

The operation of the circuit of FIG. 6 will now be described. The first control signal PCI is generated by a column address strobe signal buffer and controls an internal circuit. The data output buffer activation signal PCD opens the switches of the data output buffer, thereby transmitting new data out of the device. The data output buffer activation signal PCD is not activated while the activation control pulse signal PATSBCD is activated to a logic "LOW", even if the first control signal PCI is activated. The data output buffer activation signal PCD can be activated only when the activation control pulse signal PATSBCD is deactivated to logic "HIGH".

In contrast, the activation control pulse signal PATSBCD is not activated to a logic "LOW" while the signal PCD is activated to logic "HIGH", since node A is logic "HIGH", node B is latched to logic "LOW". Therefore, when the signal PATSBOD is activated, that is, when a new column address is received, the data output buffer activation signal PCD is not activated, and data is not applied to the data output buffer, thereby preventing a short glitch.

Figure 7:
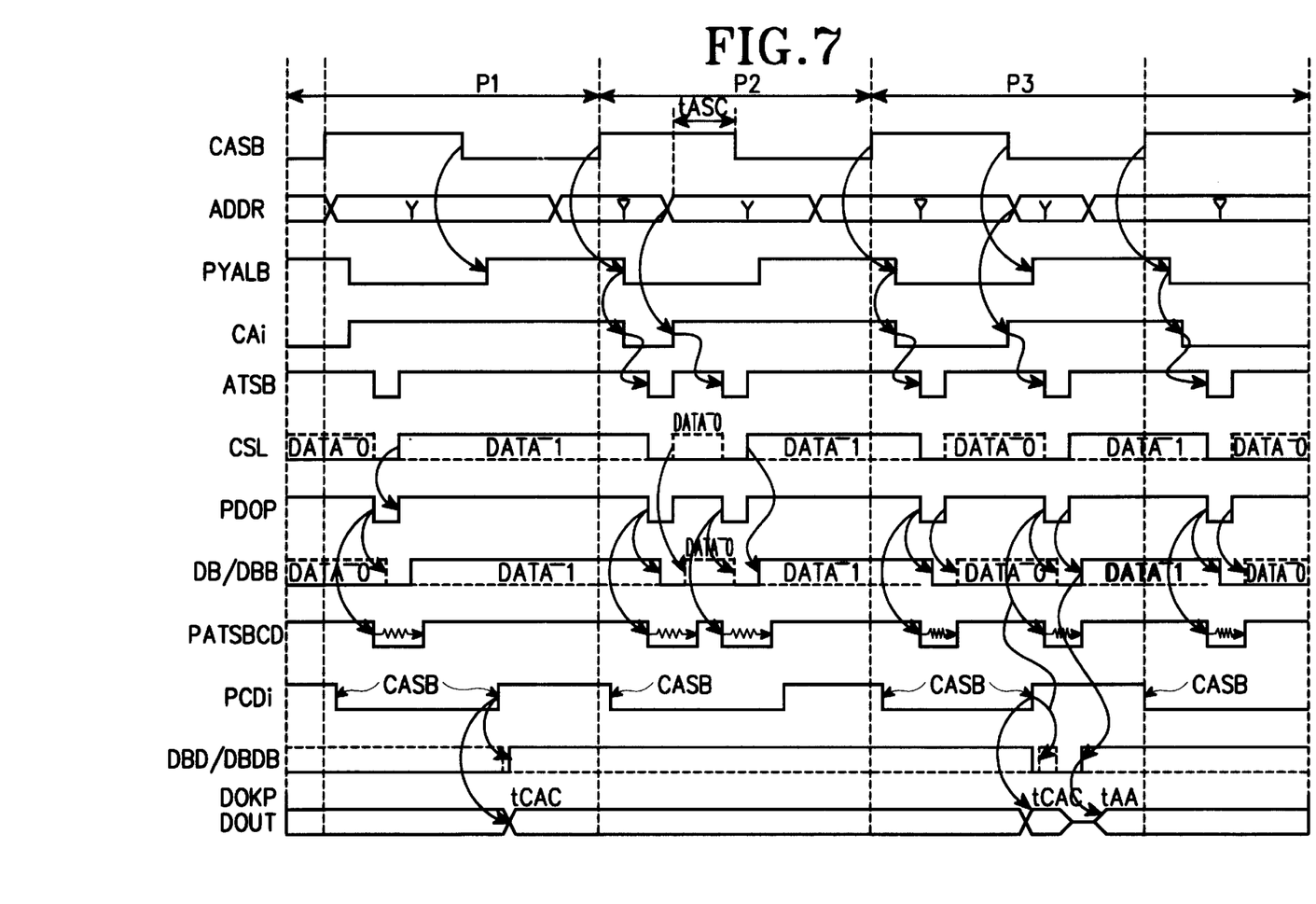
FIG. 7 is a timing chart illustrating the operation of the circuits of FIGS. 5 and 6.

FIG. 7 is a timing chart illustrating the operation of the circuits of FIGS. 5 and 6. Referring to FIG. 7, reference symbols Y and /Y indicate a valid address and an invalid address, respectively. The address transition sensing signal ATSB is activated by the invalid address /Y and again activated by the valid address Y. The activation control pulse signal PATSBCD is generated as two automatic pulses by a precharge control signal PDOP. The two pulses may appear as a unified signal depending on the difference in input time between addresses.

When a column address CAi is set up before a column address strobe signal CASB is activated (as shown during interval P1), and the column address strobe signal CASB is precharged, a latch control signal PYLB is activated to logic "LOW" to receive the column address CAi (which is converted to a CMOS level). If the column address CAi changes, the address transition sensing signal ATSB senses the address transition and causes the automatic pulse generating circuit to generate a pulse in the activation control pulse signal PATSBCD. While the activation control pulse signal PATSBCD is activated to logic "LOW", since node A is logic "LOW", node B is set to logic "HIGH" and node A is latched to logic "LOW". In this case, even if the column address strobe signal is activated and the first control signal PCI is activated to logic "HIGH", the state of node A does not change.

Thereafter, the precharge operation at the nodes DB and DBB ends and the address Y is received. After data is completely set up by the address Y, the activation control pulse signal PATSBCD is deactivated to logic "HIGH". Then, node B is set to logic "LOW", and node A changes from logic "LOW" to logic "HIGH". Since the first control signal PCI is logic "HIGH", node C is set to logic "LOW", and the data output buffer activation signal PCD is activated to logic "HIGH". The node DB is set to logic "HIGH".

If the column address CAi is set up after the column address strobe signal CASB is activated (as shown in interval P3), then, since the activation control pulse signal PATSBCD is logic "HIGH", node B is maintained at logic "LOW". If the column address strobe signal CASB is activated, the first control signal PCI is activated to logic "HIGH", and node C is set to logic "LOW". Node A is set to logic "HIGH", and node B is latched to logic "LOW". Therefore, the data output buffer activation signal PCD is activated to logic "HIGH". Thereafter, even if the activation control pulse signal PATSBCD is activated to logic "LOW", the data output buffer activation signal PCD is maintained at logic "HIGH" since node A is latched to logic "HIGH". Therefore, the invalid data is applied to the latch node DBD, and the short glitch is not generated. That is, even if any column address is applied, a stable output signal at the data output buffer can be assured.

As will be apparent from the above description, in a data output buffer control circuit in accordance with the present invention the activation control signal is generated by the address transition sensing signal, and the data output buffer activation signal is generated by using the data output buffer control circuit. Hence, even if any column address is applied, the output signal of the data output buffer is generated at a sufficient level, and thus, stable operation can be assured.

Having described and illustrated the principles of the invention in a preferred embodiment thereof, it should be apparent that the invention can be modified in arrangement and detail without departing from such principles. We claim all modifications and variations coming within the spirit and scope of the following claims:

1. A method for controlling a data output buffer for a semiconductor memory device, the method comprising:
   generating an address transition signal responsive to transitions in an address;
   generating a pulse signal responsive to the address transition signal;
   exclusively activating a data output buffer activation signal responsive to a column address strobe signal and the pulse signal during EDO mode; and
   controlling the data output buffer responsive to the data output buffer activation signal.

2. A method according to claim 1 wherein controlling the data output buffer responsive to the column address strobe signal and the pulse signal includes disabling the data output buffer for a predetermined period of time long enough to assure a column address setup time after an address transition, regardless of the state of a column address strobe signal if the column address is set up before the column address strobe signal is activated.

3. A method according to claim 1 wherein controlling the data output buffer responsive to the column address strobe signal and the pulse signal includes:
   generating a buffer activation signal responsive to the column address strobe signal and the pulse signal; and
   controlling the data output buffer responsive to the buffer activation signal.

4. A method according to claim 3 wherein generating the pulse signal responsive to transitions in the address signal includes deactivating the pulse signal for a predetermined period of time after sensing a transition in the address signal.

5. A method according to claim 4 wherein generating the buffer activation signal responsive to the column address strobe signal and the pulse signal includes:
   deactivating the buffer activation signal when the column address strobe signal is deactivated and the pulse signal is deactivated; and
   maintaining the buffer activation signal in a deactivated state for as long as the pulse signal is deactivated regardless of the state of the column address strobe signal.

6. A method according to claim 4 wherein generating the buffer activation signal responsive to the column address strobe signal and the pulse signal includes:
   activating the buffer activation signal if the column address is set up before the column address strobe signal is activated; and
   maintaining the buffer activation signal in an active state regardless of the state of the pulse signal.

7. A method for controlling a data output buffer for a semiconductor memory device, the method comprising:
   sensing transitions in an address signal;
   generating a pulse signal responsive to transitions in the address signal; and
   controlling the data output buffer responsive to a column address strobe signal and the pulse signal;
   wherein controlling the data output buffer responsive to the column address strobe signal and the pulse signal includes:
      exclusively activating a data output buffer activation signal responsive to the column address strobe signal and the pulse signal during EDO mode;
      sensing when the address is set up relative to when the column address strobe signal is activated; and
      enabling the data output buffer responsive to the data output buffer activation signal so as to maintain invalid data in the data output buffer long enough to prevent a short glitch in the data output buffer if the column address is set up after the column address strobe signal is activated, thereby assuring a setup time for valid data.

8. A data output buffer control circuit for a semiconductor memory device having a pair of bit lines and first and second switching circuits arranged for selectively transmitting output signals from said bit lines responsive to an activation signal, said data output buffer control circuit comprising:
   an automatic pulse generating circuit for generating pulses in a control signal responsive to an address transition signal; and
   a logic controller coupled to said automatic pulse generating circuit and said first and second switching circuits for generating said activation signal responsive to the control signal and a column address strobe signal to assure a column address setup time;
   wherein said logic controller exclusively activates said activation signal responsive to said column address strobe signal and said control signal during EDO made.

9. A data output buffer control circuit as claimed in claim 8, wherein said automatic pulse generating circuit includes:

a first inverter coupled to receiving and address transition sensing signal;

an inverter chain having an input terminal coupled to an output terminal of said first inverter and having a predetermined delay time; and a NOR gate having a first input coupled to an output terminal of said inverter chain and a second input coupled to the output terminal of said first inverter.

10. A data output buffer control circuit for a semiconductor memory device having a pair of bit lines and first and second switching circuits arranged for selectively transmitting output signals from said bit lines responsive to an activation signal, said data output buffer control circuit comprising:

an automatic pulse generating circuit for generating pulses in a control signal responsive to address transitions; and a logic controller coupled to said automatic pulse generating circuit and said first and second switching circuits for generating said activation signal responsive to the control signal and a column address strobe signal to assure a column address setup time;

wherein said logic controller includes:
  a first NOR gate having a first input terminal coupled to receive said control signal from said automatic pulse generating circuit, a second input terminal, and an output terminal; and
  a second NOR gate having a first input terminal coupled to receive said column address strobe signal, a second input terminal coupled to the output terminal of said first NOR gate, and an output terminal.

11. A data output buffer control circuit as claimed in claim 10, wherein said logic controller includes:

a third NOR gate having a first input terminal coupled to receive a second control signal, a second input terminal coupled to the output terminal of said second NOR gate, and an output terminal;

a first inverter coupled in series with the output terminal of said third NOR gate; and a second inverter coupled in series with the first input terminal of said second NOR gate.

12. A data output buffer control circuit for a semiconductor memory device having a pair of bit lines and first and second switching circuits arranged for selectively transmitting output signals from said bit lines responsive to an activation signal, said data output buffer control circuit comprising:

an automatic pulse generating circuit for generating pulses in a control signal responsive to an address transition sensing signal; and a logic controller coupled to said automatic pulse generating circuit for generating said activation signal responsive to a column address strobe signal and said control signal, thereby assuring a column address setup time;

wherein said logic controller exclusively activates said activation signal responsive to said column address strobe signal and said control signal during EDO mode.

13. A method for providing a stable output signal from a data output buffer for a semiconductor memory device operating in extended data output mode comprising:

sensing when a column address is set up relative to when a column address strobe signal is activated;

if the column address is set up after the column address strobe signal is activated, enabling the data output buffer responsive to a data output buffer activation signal so as to maintain invalid data in the data output buffer long enough to prevent a glitch in the data output buffer; and if the column address is set up before the column address strobe signal is activated, disabling the data output buffer responsive to the data output buffer activation signal for a predetermined period of time long enough to assure a column address setup time after an address transition, regardless of the state of the column address strobe signal;

wherein sensing when a column address is set up relative to when a column address strobe signal is activated includes exclusively exclusively activating said data output buffer activation signal during EDO mode responsive to the column address strobe signal and a pulse signal which is generated responsive to address transitions.

* * * * *

UNITED STATES PATENT AND TRADEMARK OFFICE
CERTIFICATE OF CORRECTION

PATENT NO.     : 6,094,376                                       Page 1 of 1
DATED          : July 25, 2000
INVENTOR(S)    : Park et al.

It is certified that error appears in the above-identified patent and that said Letters Patent is hereby corrected as shown below:

Column 1,
Line 64, " the another terminal" should read -- the other terminal --.

Column 3,
Line 21, "1141" should read -- 114-1 --.

Column 6,
Line 42, "PATSBOD" should read -- PATSBCD --.

Column 10,
Line 39, "includes exclusively exclusively activating" should read -- includes exclusively activating --.

Signed and Sealed this

Twentieth Day of August, 2002

Attest:

JAMES E. ROGAN
Attesting Officer                Director of the United States Patent and Trademark Office